United States Patent
Hammerschmidt

(10) Patent No.: US 7,923,998 B2
(45) Date of Patent: Apr. 12, 2011

(54) SENSOR DEVICE

(75) Inventor: Dirk Hammerschmidt, Villach (AT)

(73) Assignee: Infineon Technologies AG, Neubiberg (DE)

( * ) Notice: Subject to any disclaimer, the term of this patent is extended or adjusted under 35 U.S.C. 154(b) by 962 days.

(21) Appl. No.: 11/462,125

(22) Filed: Aug. 3, 2006

(65) Prior Publication Data

US 2008/0012557 A1  Jan. 17, 2008

(30) Foreign Application Priority Data

Jul. 12, 2006  (DE) .......................... 10 2006 032 266

(51) Int. Cl.
*G01R 33/02* (2006.01)
(52) U.S. Cl. ...................................... 324/252
(58) Field of Classification Search ............ 324/252
See application file for complete search history.

(56) References Cited

U.S. PATENT DOCUMENTS

| | | | |
|---|---|---|---|
| 4,466,284 A | 8/1984 | Dumery | |
| 5,686,837 A | 11/1997 | Coehoorn et al. | 324/252 |
| 5,859,592 A | 1/1999 | Carlin | 340/815.45 |
| 5,949,051 A | 9/1999 | Kiriyama | |
| 6,027,397 A | 2/2000 | Church et al. | |
| 6,291,982 B1 * | 9/2001 | Prabhu | 324/95 |
| 6,433,545 B1 | 8/2002 | Kunze et al. | |
| 6,452,382 B1 | 9/2002 | Tokunaga et al. | 324/207.21 |
| 2003/0094944 A1 | 5/2003 | Suzuki et al. | |
| 2006/0050444 A1 | 3/2006 | Fukuzawa et al. | |
| 2007/0046102 A1 | 3/2007 | Reithofer | 307/10.1 |
| 2007/0047294 A1 | 3/2007 | Panchula | |

FOREIGN PATENT DOCUMENTS

| | | |
|---|---|---|
| DE | 286 22 A5 | 1/1991 |
| DE | 4135381 | 4/1993 |
| DE | 19854713 | 11/1998 |
| DE | 19933243 | 7/1999 |
| DE | 198 10 838 A1 | 9/1999 |
| DE | 198 39 450 A1 | 3/2000 |
| DE | 697 05 928 T2 | 4/2002 |
| DE | 10113131 | 9/2002 |

OTHER PUBLICATIONS

Smith et al. "Chip-Size Magnetic Sensor Arrays" NVE Corporation, Sensors EXPO (11 pages), May 21, 2002.
German Office Action for German Application No. 10 2006 032 266.5 (4 pages), Apr. 26, 2007.
Melexis, Microelectronic Integrated Systems, MLX90316 Rotary Position Sensor IC, 34 pages, Oct. 4, 2005.
"Hall sensors get ahead", Helmuth Lemme, Elektronic, Sep. 2005, 16 pages total.
2D Magnetic Microsensor with On-Chip signal Processing for Contactless Angle Measurement, Andreas Häberll, Michael Schneider, Piero Maloovati, Ruggero Castagnetti, Franco Maloberll and Henry Baltes, IEEE International Solid State Circuits Conference, ISSSCC96, Feb. 10, 1996, 3 pgs.

(Continued)

*Primary Examiner* — Reena Aurora
(74) *Attorney, Agent, or Firm* — Eschweiler & Associates, LLC

(57) ABSTRACT

A sensor device has a sensor assembly with at least one sensor element, an additional sensor assembly having at least one additional sensor element, and a switch-in element which couples the additional sensor assembly to the sensor assembly responsive to a switch-in signal to obtain an overall sensor assembly having a reduced power demand.

27 Claims, 5 Drawing Sheets

OTHER PUBLICATIONS

Restriction Requirement from U.S. Appl. No. 11/462,150 dated Mar. 6, 2009.
Non-Final Office Action From U.S. Appl. No. 11/462,150 dated May 21, 2009.
Non-Final Office Action dated Nov. 20, 2009 for U.S. Appl. No. 11/462,150. 23 Pages.
Final Office Action dated May 3, 2010 for U.S. Appl. No. 11/462,150. 19 Pages.
Office Action dated Aug. 30, 2010 for U.S. Appl. No. 11/462,150. 16 Pages.
Final Office Action dated Jan. 31, 2011 for U.S. Appl. No. 11/462,150.

* cited by examiner

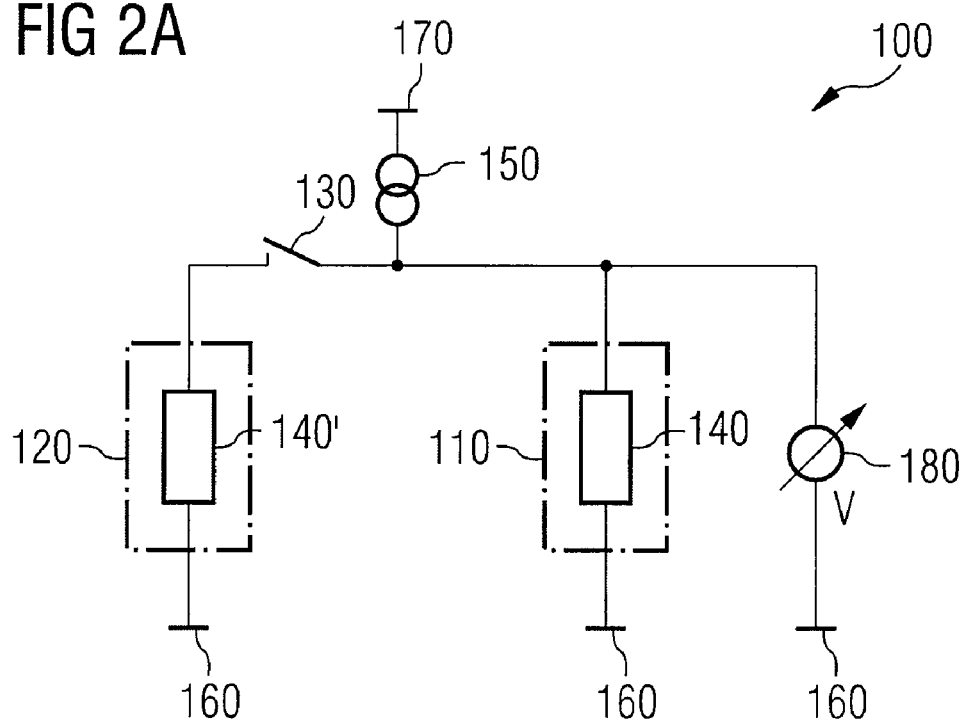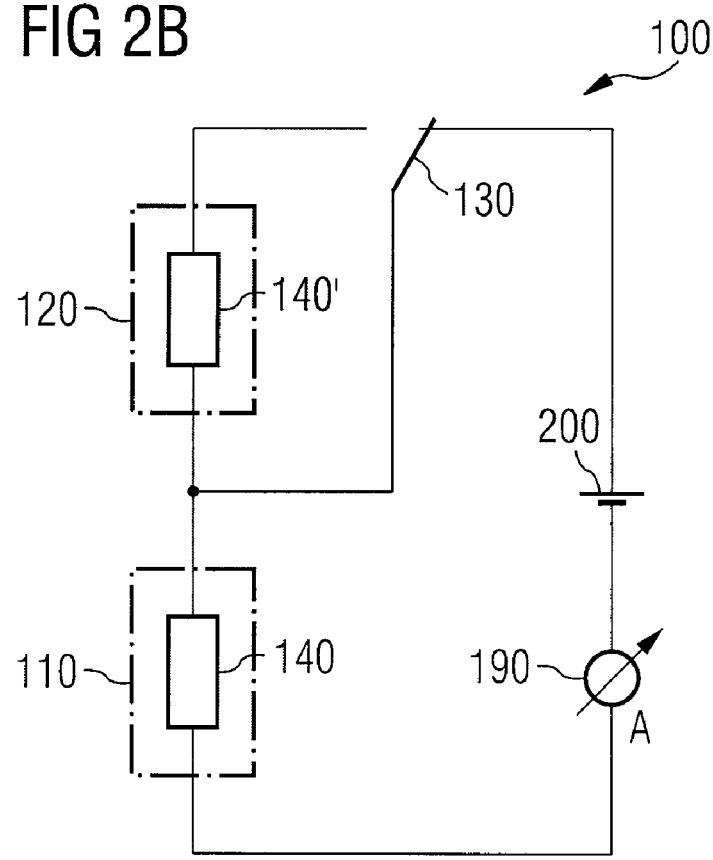

SENSOR DEVICE

CROSS-REFERENCE TO RELATED APPLICATIONS

This application claims priority to German Patent Application No. 10 2006 032 266.5 filed Jul. 12, 2006, the contents of which are hereby incorporated by reference its entirety.

TECHNICAL FIELD

The present invention relates to a sensor device, in particular to a sensor device having resistive sensor elements for detecting a magnetic field by means of magneto-resistive sensor elements or for detecting a pressure by means of piezo-resistive sensor elements which may be operated in an energy-saving mode.

BACKGROUND

In many sensors and sensor devices, there is the problem that, due to physical limitations and other general conditions, sensors cannot be employed with high precision in connection with energy-saving applications. In the case of a GMR (giant magneto resistance) angle sensor for measuring an x component and a y component of a magnetic field for determining an angle of the magnetic field relative to a chip axis of the respective sensor, for example, homogeneity of the magnetic field in the entire range of a geometric extension of the GMR angle sensor or sensor is an essential prerequisite for an exact angle measurement. In order to ensure this or at least to allow this, on the one hand, exact adjustment of the sensor below a rotational axis of a magnet the angle position of which is to be determined within a completed unit with the respective angle sensor, is necessary. On the other hand, this restricts the geometrical extension of the GMR angle sensor and, thus, a possible length of resistor runs of the GMR sensor elements of the sensor. A consequence of this restriction is that a maximum resistance of a GMR sensor element of the corresponding sensor for measuring the field angle is limited to a few kilo-ohm, which in the end restricts the sensor's suitability for high precision current-saving applications (low-power applications) significantly.

Similar restrictions apply for micromechanical piezo-resistive sensors and sensor devices where the resistive sensor element or the resistor by means of which a mechanical deformation of a diaphragm is to be detected is no longer in a zone of maximal deformation or maximal stress. In the case of pressure sensors having piezo-resistive sensor elements, these, however, should be in the zone of maximal stress in order to achieve or allow the greatest sensor sensitivity possible. If the resistor or the resistive sensor element is increased to obtain a higher resistance, it will at least partly geometrically extend into regions of small deformation so that the sensitivity of the respective sensor element will decrease significantly.

SUMMARY

A sensor device may comprise a sensor assembly having at least one sensor element, an additional sensor assembly having at least one additional sensor element, and a switch-in element coupling the additional sensor assembly to the sensor assembly responsive to a switch-in signal to obtain an overall sensor assembly having a reduced power demand.

BRIEF DESCRIPTION OF THE DRAWINGS

Embodiments of the present invention will be discussed in greater detail subsequently referring to the appended drawings.

FIG. 2a shows a circuit diagram of a second embodiment of a sensor device;

FIG. 2b shows a third embodiment of a sensor device;

FIG. 4b shows a block circuit diagram of a bridge configuration of the embodiment of a sensor device shown in FIG. 4a;

FIG. 5b shows a block circuit diagram of a bridge configuration of the embodiment shown in FIG. 5a.

DETAILED DESCRIPTION

According to an embodiment, a sensor device for detecting a measurable quantity by an overall sensor assembly may comprise a sensor assembly having at least one resistive sensor element, an additional sensor assembly having at least one additional resistive sensor element, a switch-in element coupled to the additional sensor assembly, and a control circuit coupled to the switch-in element such that the sensor assembly, starting from the sensor assembly as an overall sensor assembly, is coupled to the additional sensor assembly responsive to a switch-in signal to form the overall sensor assembly having a reduced power demand.

According to an embodiment, a sensor apparatus may comprise sensor means having at least one detection means for detecting a measurable quantity, additional sensor means having at least one additional detection means, and switch-in means coupling the additional sensor means to the sensor means responsive to a switch-in signal to obtain an overall sensor assembly having a reduced power demand.

According to an embodiment, a method for detecting a measurable quantity by a sensor device comprising a sensor assembly having at least one sensor element and an additional sensor assembly having at least one additional sensor element may comprise a step of switching in the additional sensor assembly to the sensor assembly to obtain an overall sensor assembly having a reduced power demand.

A first embodiment of a sensor device will be described referring to FIGS. 1-5, whereupon further embodiments will be discussed in connection with FIGS. 2a-5b.

Figure 1:
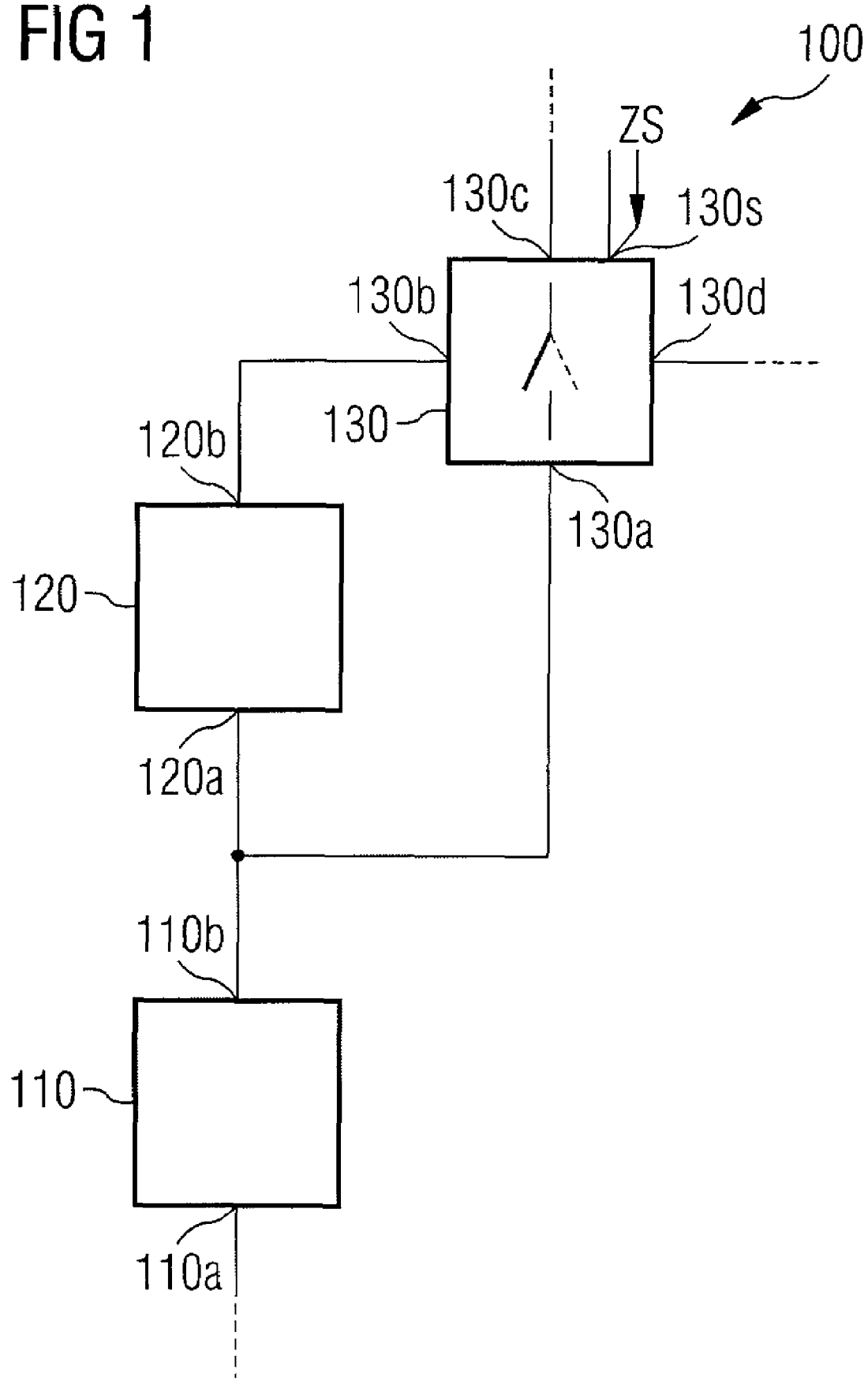
FIG. 1 shows a block circuit diagram of a first embodiment of a sensor device.

FIG. 1 shows, as a first embodiment, a sensor device 100 comprising a sensor assembly 110 and an additional sensor assembly 120. The sensor assembly 110 and the additional sensor assembly 120 each include at least one sensor element for detecting a measurable quantity. In the embodiment shown in FIG. 1, as is also the case in the further embodiments, the sensor elements may, for example, be resistive sensor elements exhibiting a change in resistance if an influence typical of the respective sensor elements acts on the respective sensor element. If the resistive sensor elements are, for example, magneto-resistive sensor elements, they will exhibit a change in electric resistance if a magnetic field having a variable magnetic field direction and/or variable field strength acts upon them. Typically, magneto-resistive sensor elements in this embodiment, as is also the case for the embodiments discussed in the course of the present application, include one or several GMR (giant magneto resistance) structures, TMR (tunnel magneto resistance) structures, AMR (anisotropic magneto resistance) structures, EMR (extraordinary magneto resistance) structures or spin-valve structures. Many of these magneto-resistive sensor elements exemplarily exhibit a change in electric resistance in dependence on a direction or field direction of a magnetic field acting upon the respective magneto-resistive sensor elements.

Other resistive sensor elements exemplarily include piezo-resistive sensor elements exhibiting a change in electric resistance if the respective sensor elements are stressed with regard to mechanical stress, such as, for example, bending or another change in shape. Piezo-resistive sensor elements of this kind are, for example, implemented in the form of metal or semi-conducting strain gauges. They are, for example, suitable for measuring a deformation of a diaphragm in connection with a pressure sensor.

Magneto-resistive sensor elements in contrast may, for example, be employed in connection with angle sensors or revolution sensors where a change or modulation of a field strength or direction of an external magnetic field is to be detected. In the case of angle sensors which may be implemented in a corresponding unit a corresponding change in a direction of a magnetic field is frequently achieved by rotating a (permanent) magnet which is arranged and rotated above a corresponding magneto-resistive sensor element or a sensor assembly having at least one magneto-resistive sensor element.

Magneto-resistive sensor elements which are also used for detecting a change in direction or a change in the field strength of an external magnetic field caused by the respective rotation to be detected are employed in the case of speed sensors.

Generally, other elements than resistive sensor elements can be employed in connection with the sensor assembly 110 and the additional sensor assembly 120. Hall sensors and capacitive sensors are examples of this.

In the embodiment of a sensor device 100 shown in FIG. 1, the sensor assembly 110 is connected to one or several electrical components not shown in FIG. 1 via a first terminal 110a. These electrical components not shown in FIG. 1 may, for example, be a supply circuit, an evaluation circuit, a control circuit or a communication circuit for communicating with other sensor devices or systems. By means of a second terminal 110b, the sensor assembly 110 is coupled to both a first terminal 120a of the additional sensor assembly 120 and also to a first terminal 130a of a switch-in element 130. The additional sensor assembly 120 is additionally connected to a second terminal 130b of the switch-in element 130 at a second terminal 120b. The switch-in element 130 is connected to further components not shown in FIG. 1 either via a third terminal 130c and an optional fourth terminal 130d. These components may, again, be supply circuits, evaluation circuits, communication circuits or control circuits. In addition, the switch-in element 130 shown in FIG. 1 has a control terminal 130s by means of which a corresponding switch-in signal ZS coupling the additional sensor assembly 120 to the sensor assembly 110 may be provided to the switch-in element 130 to form an overall sensor assembly having a reduced power demand.

If, for example, the sensor elements of the sensor assembly 110 and the additional sensor assembly 120 are resistive sensor elements which are provided with a (constant) voltage via a voltage source of a supply circuit, the switch-in element 130 may, for example, be configured such that the supply circuit, in particular the voltage source, is connected to the switch-in element 130 and such that, in dependence on the switch-in signal ZS, the switch-in element 130 provides the voltage directly to the sensor assembly 110 via its first terminal 130a or to the additional sensor assembly 120 via its second terminal 130b. If a current flow to, for example, a reference potential (ground or negative supply voltage) is, for example, dissipated in both cases via the first terminal 110a of the sensor assembly 110, the result will, in a first operating mode (normal operation mode), be a state of the sensor device 100 where the sensor assembly 110 will be used for detecting the measurable quantity.

If, responsive to the switch-in signal ZS, the switch-in element 130 is switched such that the voltage source is coupled to the additional sensor assembly 120, whereas the direct connection between the sensor assembly 110 and the voltage source is disconnected, the result will be a series connection of the sensor assembly 110 and the additional sensor assembly 120 representing the overall sensor assembly. In this second operation mode (current-saving mode), the power demand of the overall sensor assembly including the two sensor assemblies 110, 120 is reduced due to the greater resistance of the series connection. Compared to a simple reduction of the supply voltage by the voltage source, in this embodiment and with this variation the result will be the advantage that the power demand of the overall sensor assembly has been reduced, however, without resulting in a significant deterioration in the signal-to-noise ratio (SNR), since both sensor assemblies 110, 112 each comprise at least one sensor element and, thus, contribute to a measuring signal. If, for example, a corresponding reduction in voltage, in the case of a fixed external supply voltage, resulted from connecting in series a resistor element having an (essentially) constant resistance, this resistor element would not contribute to the actual measuring signal.

In another variation in connection with the embodiment shown in FIG. 1, a current source of a supply circuit may, for example, be connected to the third terminal 130c of the switch-in element 130 which, independently of the switch-in signal ZS arriving at the control signal input 130s, provides a current of the current source to both sensor assemblies 110, 120 at the two terminals 110b and 120a via the first terminal 130a. In this embodiment, the first terminal 110a of the sensor assembly 110 may, for example, additionally be connected to the reference potential, such as, for example, ground. If additionally the optional fourth terminal 130d of the switch-in element 130 is also connected to the reference potential and if the switch-in element 130 is configured to electrically connect the second terminal 130b to the optional fourth terminal 130d responsive to the switch-in signal ZS, the current of the current source will flow to a parallel connection of the two sensor assemblies 110, 120 and to ground via the third terminal 130c and the first terminal 130a in the second operating mode, i.e. if the switch-in signal ZS has been provided to the control terminal 130s of the switch-in element.

In this operating state, the electric resistance of the overall sensor assembly achieved here is reduced due to connecting the two sensor assemblies 110, 120 in parallel so that a decreased power demand of the overall sensor assembly compared to the power demand of the sensor assembly 110 alone can be achieved. If, however, the switch-in signal ZS has not been provided to the switch-in element 130, i.e. if the second terminal 130b is disconnected from the optional fourth terminal 130d of the switch-in element 130, the current of the current source will only flow via the sensor assembly 110, which corresponds to the first operating mode (normal operating mode).

In this second variation of the embodiment shown in FIG. 1, too, the result is a reduction in the power demand of the respective sensor device due to the reduction of the electric resistance of the overall sensor assembly accompanying the parallel connection of the two sensor assemblies 110, 120. If, for example, a corresponding reduction in the current provided by the current source took place by connecting a resistor element having an (essentially) constant resistance in parallel, i.e. if a part of the current was dissipated via a (resistive) path, this part of the current would not contribute to the actual measuring signal.

Thus, one embodiment is based on the finding that a sensor device 100 is provided allowing precise detection of a measurable quantity on the one hand and a reduced power demand or power consumption on the other hand by the sensor device 100 comprising a sensor assembly 110 and an additional sensor assembly 120, wherein the additional sensor assembly 120 can be coupled to the sensor assembly 110 via the switch-in element 130 to form an overall sensor assembly having a reduced power demand. While only the sensor assembly 110 is employed for detecting the measurable quantity in connection with a precise measurement, in the energy-saving mode the additional sensor assembly 120 can be connected via the switch-in element 130 to the sensor assembly 110 to form the overall sensor assembly having a lower power demand, without significantly deteriorating the signal-to-noise ratio.

An advantage of an embodiment, thus, is that a sensor device is able to detect a measurable quantity in a first operating mode by the sensor assembly. In a second operating mode, the additional sensor assembly can be coupled by the switch-in element to the sensor assembly to form an overall sensor assembly to detect the measurable quantity, wherein the overall sensor assembly including the additional sensor assembly has a reduced power demand compared to the sensor assembly. The first operating mode may, for example, be a normal operating mode and the second operating mode may be an energy-saving mode of an embodiment of a sensor device.

It is of particular advantage in this context that both resistive sensor elements and other sensor elements may be employed in different embodiments of sensor devices. In one embodiment, for example, magneto-resistive sensor elements may be implemented, whereas in another embodiment piezoresistive sensor elements may be integrated to make different measurable quantities detectable. In the case of magneto-resistive sensor elements, one embodiment of a sensor device 100, thus, is sensitive to magnetic fields (field strength and/or direction of the magnetic field), whereas in the case of piezo-resistive sensor elements, the embodiment of a sensor device 100 is sensitive to mechanical deformation, which may, exemplarily, be used in connection with pressure sensors.

In addition, another advantage of an embodiment is that, apart from individual sensor elements, more complex circuits of sensor elements, too, may be employed in connection with a sensor assembly 110, 120 which may, exemplarily, comprise full bridge circuits or series connections including at least one sensor element. Another advantage of an embodiment is that a sensor device 100 may be operated both in connection with a supply circuit including a voltage source and in connection with a supply circuit including a current source. As has already been discussed, a reduction in the power demand may be achieved in the case of fixed external supply conditions (predetermined current value, predetermined voltage value), without significantly deteriorating a resulting measuring signal relative to its modulation and/or signal intensity.

Put differently, in the case of an embodiment of a sensor device 100, the sensor elements may be divided such that some of the sensor elements, however at least one sensor element, are in an optimum position so that in a normal operating mode or in normal operation the result will be a sensor assembly 110 having the greatest sensitivity possible. In the case of operation with reduced power demand, i.e. in a current-saving operating mode, as may, for example, be required in the case of battery buffering or in the case of a parking vehicle, the sensor device 100 may be reconfigured such that detection of a measurable quantity no longer takes place by the sensor assembly 110 alone but that by switching in the additional sensor assembly 120 to the sensor assembly 110 the result will be an overall sensor assembly having a reduced power demand. Here, at least one additional sensor element of the additional sensor assembly 120 may also be used outside the optimum position to realize the reduced power demand of the overall sensor assembly in the current-saving operating mode.

Even if the overall sensor assembly, by switching in the additional sensor assembly 120 to the sensor assembly 110, is no longer in the optimum geometrical position, it will typically nevertheless exhibit a considerable measuring effect. Compared to a geometrically optimum sensor assembly which may also have a reduced power demand by, for example, applying a reduced supply voltage, the result will be a higher overall sensitivity of the overall sensor assembly with a comparable power demand.

In the course of the present application, same reference numerals will be used for objects and functional units having the same or similar functional features. In addition, summarizing reference numerals will in the course of the present application be used for objects which are, exemplarily, included several times in one embodiment, in case not a certain individual object is referred to.

In this context, it is worth mentioning that, on the one hand, in case there is no explicit statement to the contrary, portions relating to objects having similar or same functional features and/or objects having summarizing reference numerals are interchangeable between the descriptions of different embodiments. On the other hand, it is to be pointed out that common usage of a reference numeral or of a reference numeral for an object occurring several times in one embodiment or in more than one embodiment does not mean that these comprise identical features and characteristics in the respective embodiments or the respective embodiment. Common or similar reference numerals consequently do not represent statements as to the specific design and/or dimensioning. Exemplarily, sensor elements which in the further course are referred to by a single summarizing reference numeral may really comprise different elements in different embodiments, but also within one embodiment and may differ with regard to their dimensioning, such as, for example, their electric resistances.

FIG. 2a shows another embodiment of a sensor device 100 comprising a sensor assembly 110, an additional sensor assembly 120 and a switch-in element 130. In contrast to the block circuit diagram shown in FIG. 1, FIG. 2a shows a specific circuit diagram where the sensor assembly 110 includes a sensor element 140 which is, on the one hand, connected to a current source 150 and, on the other hand, to a terminal 160 for a reference potential, such as, for example, ground (GND). The current source 150 additionally is connected to another terminal 170 for the reference potential.

The additional sensor assembly 120 in the embodiment of a sensor device 100 shown in FIG. 2a includes an additional sensor element 140' which, on the one hand, is also coupled to a terminal for the reference potential 160 and, on the other hand, is connected, in parallel to the sensor assembly 110, to the current source 150 via the switch-in element 130. A voltage-measuring device in the form of a voltmeter 180 is, parallel to the two sensor assemblies 110, 120, connected between the current source 150 and the terminal 160 for the reference potential. The voltmeter 180 in this embodiment represents an evaluation circuit.

In the embodiment shown in FIG. 2a, the two sensor elements 140, 140' are resistive sensor elements which, in summary, are also referred to as sensor element or sensor elements 140. The sensor elements 140 have an electric resistance which depends on which physical, chemical or other influences the respective sensor elements 140 are subjected to. As has already been discussed in connection with FIG. 1, the influence to which the sensor element reacts with a change in its electric resistance is typical of the respective sensor element. The respective sections of the description in connection with FIG. 1 are referred to for more detailed embodiments.

If the embodiment of a sensor device 100 shown in FIG. 2a is operated in a normal operating mode where the switch-in element 130 is opened so that the additional sensor assembly 120 is not coupled to the sensor assembly 110 to form an overall sensor assembly, a current provided by the current source 150 will flow off via the sensor element 140 to the terminal for the reference potential 160. Depending on an electric resistance of the (resistive) sensor element 140, a voltage measured by the voltmeter 170 will drop across the sensor assembly 110 due to the current flowing off via the sensor element 140.

If the switch-in element 130 is closed responsive to a switch-in signal, the additional sensor assembly 120 will be coupled to the sensor assembly 110 so that the result will be an overall sensor assembly including a parallel connection of the two sensor elements 140, 140'. Due to a reduction, accompanying the parallel connection, of the electric resistance of the overall sensor assembly compared to the electric resistance of the sensor assembly 110 or the sensor element 140, the overall sensor assembly, thus, has a lower power demand than the sensor assembly 110 alone. Since, however, the additional sensor assembly 120 or the additional sensor element 140' also exhibits a dependence of the electric resistance on the respective influence typical of the sensor element, the embodiment of a sensor device 100 shown in FIG. 2a also exhibits an increased measuring effect compared to a simple reduction in the current intensity of the current source 150, as may be detected by the voltmeter 170.

Put differently, switching in the additional sensor assembly 120, compared to reducing the power demand by simply reducing the current flowing through the sensor assembly 110, by switching in a corresponding resistive path connected in parallel to the sensor assembly 110 having a constant electric resistance results in advantages, since the sensor element 140' of the additional sensor assembly included in the additional sensor assembly 120 also exhibits a measuring effect.

FIG. 2b shows a third embodiment of a sensor device 100 comprising a sensor assembly 110, an additional sensor assembly 120 and a switch-in element 130. Like in the embodiment shown in FIG. 2a, the two sensor assemblies 110, 120 in the embodiment shown in FIG. 2b, too, each comprise a resistive sensor element 140, 140'. With regard to specific details on the sensor elements 140, reference is again made to the respective sections of the present description in connection with FIGS. 1 and 2a.

More explicitly, in the embodiment of a sensor device 100 shown in FIG. 2b, the sensor assembly 110 or the sensor element 140 is connected in series with a current-measuring device in the form of an amperemeter 190 as an evaluating circuit, a voltage source 200 as a supply circuit and the switch-in element 130. The switch-in element 130 is coupled to a first terminal to the additional sensor element 140' of the additional sensor assembly 120 which in turn is connected to the sensor element 140 of the sensor assembly 110. By means of a second terminal, the switch-in element 130 is directly connected to the sensor element 140 of the sensor assembly 110. The switch-in element 130 here is designed such that the voltage source 200 is either connected to only the sensor assembly 110 or its sensor element 140 or to a series connection of the sensor elements 140' and 140 or the additional sensor assembly 120 and the sensor assembly 110.

In a normal operating mode, the switch-in element 130 connects the voltage source 200 directly to the sensor assembly 110 or the sensor element 140. If, in the normal operating mode or in normal operation, a change in resistance occurs due to an influence on the sensor element 140, this will, in the case of a constant voltage supplied by the voltage source 200, result in a change in the current through the sensor element 140, which can be verified by the amperemeter 190.

In the energy-saving mode where the switch-in element 130, responsive to a switch-in signal, couples the additional sensor assembly 120 to the sensor assembly 110 in the form of a series connection to form the overall sensor assembly, the result is a reduced power demand compared to that of the sensor assembly 110 due to the accompanying increase in the electric resistance of the overall sensor assembly compared to the electric resistance of the individual sensor element 140 of the sensor assembly 110. In the embodiment shown in FIG. 2b, too, due to the additional sensor element 140' of the additional sensor assembly 120, the result is a higher measuring effect than would be the case if only the voltage of the voltage source 200 was reduced, such as, for example, by switching in a resistor element having a constant resistance.

Although in the embodiments of sensor devices 100 shown in FIGS. 2a and 2b, resistive sensor elements 140 are implemented, embodiments are not limited to resistive sensor elements. Rather, capacitive, inductive or other sensor elements, such as, for example, Hall sensors, could be used as sensor elements. In addition, departing from the embodiments illustrated in FIGS. 2a and 2b, sensor assemblies 110, 120 including more complex circuits than individual sensor elements 140 may be used. Exemplarily, series connections, full bridge circuits or other more complex circuits may be included in connection with the respective sensor assemblies 110, 120. In addition, circuit elements 140 which are not sensor elements or resistive sensor elements may also be employed in connection with the corresponding sensor assemblies 110, 120. Semiconductor devices, such as, for example, diodes, transistors, operational amplifiers or other semiconductor devices, are examples of this. Capacities, inductivities and resistor elements, such as, for example, in the form of ohmic resistors, may also be implemented in connection with the sensor assemblies 110, 120, wherein all embodiments may be designed in relation to alternating signals (such as, for example, alternating currents or alternating voltage).

Figure 3:
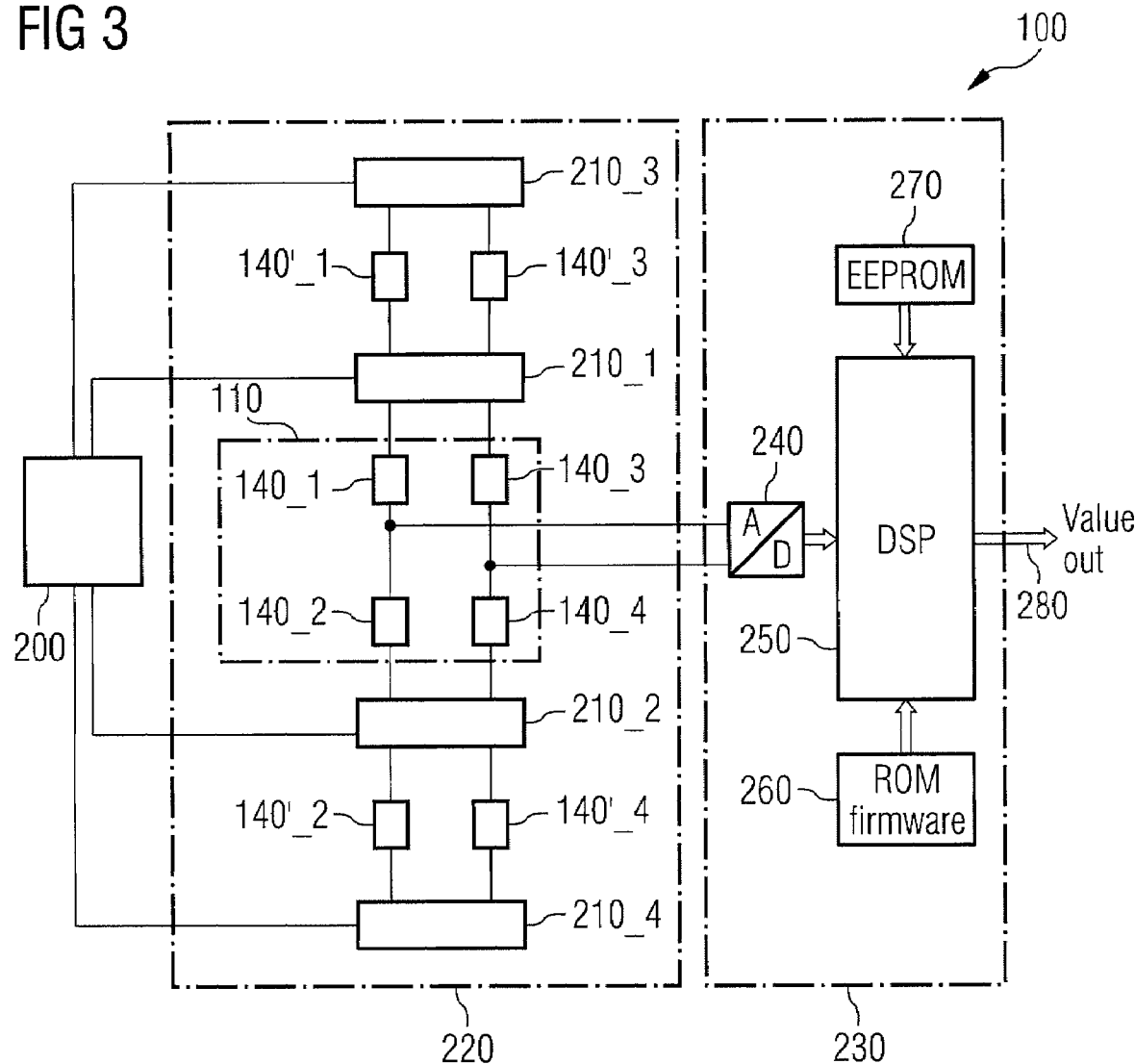
FIG. 3 shows a circuit diagram of a fourth embodiment of a sensor device in the form of a full bridge circuit.

FIG. 3 shows another embodiment of a sensor device 100 comprising a sensor assembly 110 including four sensor elements 140-1 to 140-4 connected to form a full bridge connection. Here, the sensor element 140-1 and the sensor element 140-2 are connected in series with a center tap between a first switch matrix 210-1 and a second switch matrix 210-2. Another series connection of two sensor elements 140-3 and 140-4, also with a center tap, is connected between the first switch matrix 210-1 and the second switch matrix 210-2 in parallel to the two sensor elements 140-1, 140-2. Here, the sensor elements 140-1 to 140-4 are geometrically arranged in a particularly suitable location, which is also referred to as the optimum position, so that the four sensor elements 140-1 to 140-4 represent the most effective sensor elements of the embodiment of a sensor device 100 shown in FIG. 3 with regard to the measurable quantity they are to detect. If the four sensor elements 140-1 to 140-4, which in the further course are, in summary, referred to as sensor elements 140, are resistive sensor elements, these four sensor elements will represent the most effective resistors or resistive sensor elements 140 with regard to a measurement.

The four sensor elements 140-1 to 140-4 are connected to a voltage source 200 providing one or several reference voltages to the sensor elements, via the two switch matrices 210-1, 210-2. Furthermore, the voltage source 200 is also connected to a third switch matrix 210-3 and a fourth switch matrix 210-4 which in turn are each connected to two additional sensor elements 140'-1 to 140'-4. More precisely, the first additional sensor element 140'-1 and the third additional sensor element 140'-3 are connected between the third switch matrix 210-3 and the first switch matrix 210-1. In analogy, the second additional sensor element 140'-2 and the fourth additional sensor element 140'-4 are electrically connected between the second switch matrix 210-2 and the fourth switch matrix 210-4. The four additional sensor elements 140'-1 to 140'-4, which in the further course will, in summary, be referred to as additional sensor elements 140', can be connected to the voltage source 200 via the switch matrices 210-3 and 210-4. The four additional sensor elements 140' here represent an additional sensor assembly. Also, the four switch matrices 210-1 to 210-4 are sub-components of the switch-in element 130 which may couple, if necessary, the additional sensor assembly having the four additional sensor elements 140' to the four sensor elements 140 of the sensor assembly 110 responsive to a corresponding switch-in signal.

In the embodiment illustrated in FIG. 3, the four switch matrices 210-1 to 210-4 are configured such that in a normal operating mode when detection of the measurable quantity takes place only using the four sensor elements 140, the two sensor elements 140-1 and 140-3 are connected to the voltage source 200 via the switch matrix 210-1 and the two sensor elements 140-2 and 140-4 are connected to the voltage source 200 via the switch matrix 210-2. In this operating mode, the third switch matrix 210-3 and the fourth switch matrix 210-4 separate the four additional sensor elements 140' from the voltage source 200.

In an energy-saving operating mode, the direct connection to the voltage source 200 by the two switch matrices 210-1, 210-2 may, for example, be disconnected by the first switch matrix 210-1 and the second switch matrix 210-2. These two switch matrices 210-1, 210-2 may then, responsive to the switch-in signal, each electrically connect the four sensor elements 140-1 to 140-4 directly to the corresponding additional sensor elements 140'-1 to 140'-4. Exemplarily, the first sensor element 140-1 and the first additional sensor element 140'-1 are connected in series by the first switch matrix 210-1. Correspondingly, the three sensor elements 140-2 to 140-4 are, responsive to the switch-in signal, also connected in series to the corresponding additional sensor elements 140'-2 to 140'-4 by the two switch matrices 210-1, 210-2. In addition, in this energy-saving operating mode, the third switch matrix 210-3 and the fourth switch matrix 210-4 connect the additional sensor elements 140'-1 to 140'-4 directly to the voltage source 200, so that in the energy-saving operating mode the result will be a full bridge circuit including both the sensor elements 140 and the additional sensor elements 140'.

The full bridge circuit or bridge formed in this way, thus, includes both the, due to their measuring features with regard to their geometrical arrangement, most effective resistors or sensor elements 140 and the additional sensor elements or resistors 140' which, due to their geometrical arrangement, represent less effective sensor elements or resistors. Not least to make the discussion of further embodiments in connection with FIGS. 4 and 5 easier, the four switch matrices 210, the sensor elements 140 and the additional sensor elements 140' are, in summary, also referred to as bridge configuration 220. The bridge configuration 220, thus, includes the switch-in element having the four switch matrices 210, at least partly the four sensor elements 140 of the sensor assembly 110 and the four additional sensor elements 140' of the additional sensor assembly.

The two center taps of the full bridge circuit formed by the sensor assembly or the sensor assembly and the additional sensor assembly to form the overall sensor assembly are coupled to an evaluation circuit 230. More precisely, the two center taps are coupled to an analog-to-digital converter (ADC) 240 which provides the voltage signals obtained from the two center taps differentially as a digital signal to a digital signal processor (DSP) 250. A corresponding differential processing of the two voltage signals of the center taps by the analog-to-digital converter 240 may, for example, take place by two separate converter stages in connection with the analog-to-digital converter 240 which converts the two voltage values obtained from the two center taps separately to digital signals, subtracts them from each other when calculating a difference and provides a result of this difference calculation to the digital signal processor 250.

Alternatively or additionally, a corresponding differential treatment of the two voltage signals of the center taps of the full bridge circuit may also take place by an analog circuit upstream of the actual converter stage, such as, for example, in the form of an analog differential amplifier. In this case, an implementation of a second converter stage in connection with the analog-to-digital converter 240 may, if appropriate, be omitted.

The digital signal processor 250 is additionally coupled to a read-only memory (ROM) 260 and a non-volatile memory 270 which may, for example, be an electrically erasable programmable read-only memory (EEPROM). A control program and/or an evaluation program for the digital signal processor 250 which is read and processed in the digital signal processor in connection with a start process of the sensor device 100 may be stored in the read-only memory 260. Such a program is also referred to as firmware. In contrast, a set of parameters which may be required for operating the sensor device 100 may be stored in the non-volatile memory 270. Correspondingly, further information may be stored in the non-volatile memory 270 which may, for example, be identification data, serial numbers, type designations or other information.

If the digital signal processor 250 is coupled to and controls the four switch matrices 210 of the switch-in element, the digital signal processor 250 in this case will be a control circuit which can provide the switch-in signal to the switch-in element having the four switch matrices 210 should operating the sensor device 100 require this or should this appear to be advisable.

In addition, the digital signal processor 250 comprises an evaluation signal terminal 280 where an evaluation signal is provided representing a measuring value of the sensor device 100. This may, for example, be a digital or an analog signal (value out). In the case of an analog evaluation signal, a voltage corresponding to a measuring value detected may be provided to the evaluation signal terminal 280. Depending on the specific design of the digital signal processor 250, corrections and compensations which, for example, at least partly compensate environmental influences, manufacturing influences and/or aging influences of the sensor, may be considered in connection with the evaluation signal. The influence of a temperature of the sensor device 100, a pressure applied to the corresponding sensor device or other parameters are examples of this.

In the embodiment of a sensor device 100 shown in FIG. 3, the sensor elements, i.e. the sensor elements 140 and the additional sensor elements 140', are divided such that a part thereof is in the optimum position so that in the normal operating mode or in normal operation the result will be a bridge or full bridge circuit having the greatest sensitivity possible. In the case of operation with reduced power demand (energy-saving operating mode), as may, for example, be necessary in the case of battery buffering or in the case of a parking car or motor vehicle, the bridge or the sensor assembly used for detecting a measuring value may be reconfigured. By the reconfiguration effected, responsive to the switch-in signal, by the switch-in element in the form of four switch matrices 210, an electric resistance of the overall sensor assembly or the resulting reconfigured full bridge circuit is increased by switching in the additional resistor elements or sensor elements 140' outside the optimum position.

Even if the resulting overall sensor assembly is no longer in the optimum geometrical position due to the switched-in additional sensor elements 140', the additional sensor elements 140' will nevertheless exhibit a considerable measuring effect. In comparison to a geometrically optimum bridge having smaller resistors or sensor elements 140 with smaller electric resistances and a correspondingly reduced supply voltage, the result will, with the same current consumption or the same power demand, be a higher overall sensitivity of the bridge with the, due to switching in the additional sensor elements 140', greater resistances. The reason for this is that in many implementations a constant voltage is provided to the sensor device 100 from outside. This may, for example, take place by a battery or an accumulator providing a constant or quasi-constant voltage. In such an implementation, a reduction in voltage is usually produced or caused by switching in a corresponding resistor element, wherein, however, in contrast to the concept discussed in connection with the present application, an additional voltage drop across the corresponding resistor element is generally not used for measuring purposes.

In the embodiment of a sensor device 100 shown in FIG. 3, the signal path, i.e. basically the evaluation circuit 230 together with the corresponding center taps of the full bridge circuit, corresponds exactly to the signal path of a sensor with no additional resistor extension option, which is realized by the switch-in element in the form of the four switch matrices 210-1 to 210-4 and the additional sensor elements 140'. The signals of the individual sensor elements obtained from the sensor assembly or the overall sensor assembly in the form of voltage signals are converted to digital signals by the analog-to-digital converter 240 and further processed by the digital signal processor 250, for example to form an output angle, an output value or another evaluation signal, and provided to the evaluation signal output 280.

It is to be mentioned in this context that the signal path in the embodiment shown in FIG. 3 is only illustrated exemplarily and may differ for further embodiments. Examples of corresponding deviating signal paths have already been shown in the embodiments of FIGS. 2a and 2b where the evaluation circuit is realized by a voltmeter 180 or amperemeter 190.

In the embodiment shown in FIG. 3, instead of the analog-to-digital converter 240, alternatively or additionally, an analog amplifier, such as, for example, an analog differential amplifier operating on the basis of an operational amplifier, may be used for evaluating the voltage signal obtained from the full bridge circuit or bridge.

The embodiment shown in FIG. 3, thus, includes a controllable extension of a sensor bridge which may be used in connection with a combination of an application with high requirement or high precision. It may, however, additionally also be operated in an energy-saving operating mode (low power mode) where a reduced measuring precision may be tolerable as long as this is assumed to be necessary or required in order to meet a power limitation. A corresponding decreased measuring imprecision may, for example, result from distortions occurring due to using sensor elements 140' which are not arranged in the optimum position. However, other distortions of the measuring signal from the full bridge circuit or a general deterioration in the signal-to-noise ratio might also result.

If the embodiment of a sensor device 100 shown in FIG. 3 is a magneto-resistive sensor device for measuring a number of revolutions, the sensor elements 140 and the additional sensor elements 140' may be implemented in the form of magneto-resistive sensor elements, such as, for example, GMR elements. In the case of a revolution sensor, all the magneto-resistive sensor elements 140, 140' of the embodiment illustrated may be conditioned in relation to a common direction so that they have a common characteristic magnetic field direction. In the case of many magneto-resistive sensor elements, such a characteristic magnetic field direction is "written" to a magneto-resistive sensor element by heating the respective sensor element to a temperature which is above a so-called blocking temperature. The blocking temperature here is a characteristic temperature for the respective sensor element which is predetermined by a hard-magnetic layer of the respective magneto-resistive sensor or by a synthetic anti-ferro magnet which the respective magneto-resistive sensor element includes.

Such a magneto-resistive sensor element further includes a soft-magnetic layer having a magnetization the orientation of which to the hard-magnetic layer influences an electric resistance of the respective magneto-resistive sensor element. If, in connection with a so-called conditioning process or in connection with conditioning, a magneto-resistive sensor element is heated to a temperature above the blocking temperature and subsequently cooled down in a magnetic field of a corresponding orientation, the magnetization of the respective hard-magnetic layer or the synthetic anti-ferro magnet will be fixed.

In the case of an angle sensor having a 180° range of angles, however, it is advisable to implement the sensor elements 140 and the additional sensor elements 140' partly with essentially opposite characteristic magnetic field directions. Typically, in this case the additional sensor elements 140'-1 and 140'-4 and the sensor elements 140-1 and 140-4 have a basically identical characteristic magnetic field direction, whereas the other sensor elements 140-2 and 140-3 and the additional sensor elements 140'-3 and 140'-2 have a basically opposite characteristic magnetic field direction.

Examples of such applications are angle positional sensors having revolution counters in the field of motor vehicles, wherein an angle of a steering wheel or control wheel of a parking vehicle, for example, does not have to be measured exactly, but the revolution counter of which should nevertheless be updated in order for an angle of the steering wheel, i.e. a steering turning angle, to be immediately associated to the correct revolution when activating the normal operating mode (highly precise mode). As has already been discussed, requirements of this kind exist, for example, in the field of measuring the steering angle, but also in motor-operated servo-drives where several revolutions are permitted.

In the case of pressure sensors, a possible field of application is in the field of measuring the tyre pressure of a motor vehicle wherein for a parking vehicle slight imprecision seems to be tolerable to save, for example, the battery of a module implemented and arranged in the respective tire, whereas when driving precision of the measurement should be given priority for reasons of safety.

Figure 4A:
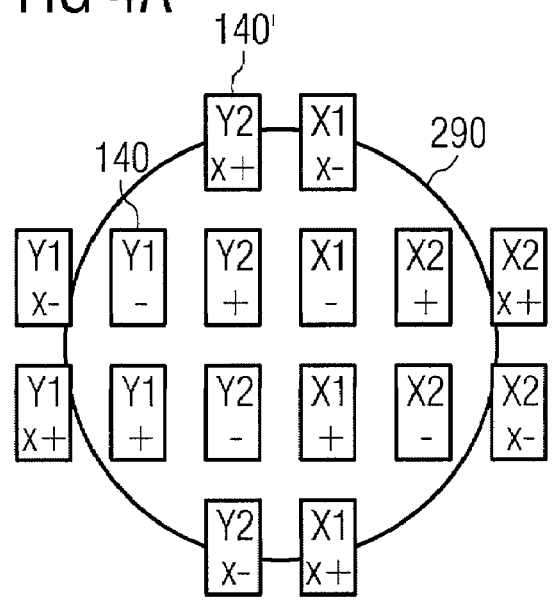
FIG. 4a shows a geometrical arrangement of the sensor elements and additional sensor elements of the sensor assembly and of the additional sensor assembly of a GMR angle sensor having a 360° range of angles according to another embodiment.

FIG. 4a shows a geometrical arrangement of sensor elements 140 and additional sensor elements 140' on a carrier or a chip for a magneto-resistive angle sensor having a 360° range of angles. A magneto-resistive angle sensor, for example, a GMR angle sensor, for measuring a direction of a magnetic field having a 360° range of angles is typically formed such that the respective angle sensor measures both an x component and a y component of the respective magnetic field in relation to a privileged direction determined by the respective angle sensor, such as, for example, the chip axis. For this purpose, corresponding angle sensors typically comprise two full bridge circuits which are oriented in relation to two basically perpendicular privileged directions. Within each full bridge circuit or full bridge, about half of the respective sensor elements each comprise a characteristic magnetic field direction which is basically opposite to that of the other half of magneto-resistive sensor elements.

As has already been explained in the introductory sections of the present application, a measuring precision obtainable here depends on a homogeneity of the respective external magnetic field the direction of which is to be determined in the geometrical range of the magneto-resistive sensor elements. In FIG. 4a, such a range of a best field homogeneity 290 is indicated which, exemplarily, is below a rotating (permanent) magnet in the case of a unit having an angle sensor. While the sensor elements 140 of the sensor assembly, for the normal operating mode, are completely arranged within the region 290, the additional sensor elements 140' are partly arranged completely outside the respective region, partly in the edge region of the respective region 290.

Here, in the geometrical configuration of the individual sensor elements 140 and the additional sensor elements 140' of a sensor device indicated in FIG. 4a, a statement "X" or "Y" designates an orientation with regard to the x axis or the y axis of the characteristic magnetic field direction of the respective sensor element 140, 140'. In addition, in FIG. 4a the additional sensor elements are marked by a designation "x". The marks "+" and "−" shown in FIG. 4a completely designate, together with the indication of the respective component, the orientation of the characteristic magnetic field direction of the respective sensor element 140, 140'. Thus, for example in the case of a GMR element, a sensor element 140 or an additional sensor element 140' having a designation of "Y+" has a minimum resistance when a direction of the external magnetic field matches the positive y direction in relation to the privileged direction of the respective sensor device or the chip axis. The numbers of the sensor elements 140 shown in FIGS. 4a and 4b describe their membership to the first or second half bridge circuit of the full bridge circuit.

An example of an arrangement of the bridge resistors or the sensor elements 140, 140' in the case of a magneto-resistive angle sensor, such as, for example, of a GMR angle sensor is given in the geometrical configuration of the respective embodiment illustrated in FIG. 4a, thus. The "internal resistors", i.e. the sensor elements 140 of the sensor assembly, are, thus, in the region 290 where the best homogeneity of the external magnetic field or of the measuring field is to be expected, whereas the additional sensor elements 140', which are also referred to as extension resistors, are placed at the edge of the respective region 290 and presumably experience field conditions which deviate (slightly) from those within the respective region 290. If the additional sensor elements 140 are connected to form an overall sensor assembly in connection with a greater measuring bridge, an error or measuring error or measuring imprecision with regard to determining an angle will increase with high probability, however the precision which the enlarged bridge provides or allows is more than sufficient for a revolution counter.

Figure 4B:
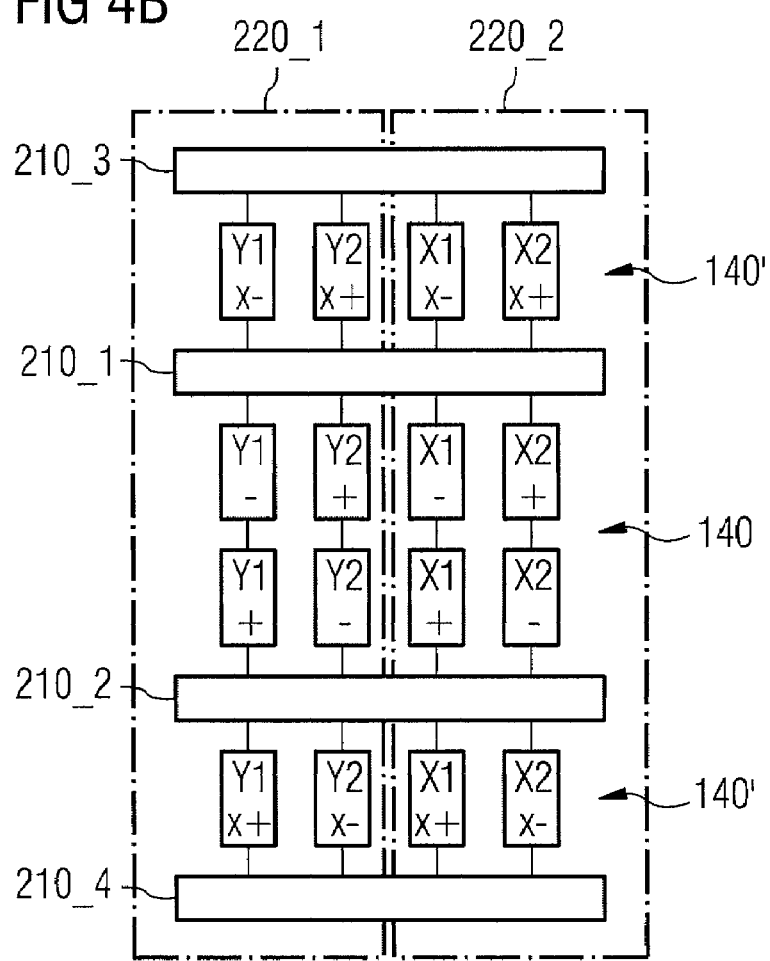

FIG. 4b shows the bridge configuration belonging to FIG. 4a or pertaining bridge configurations 220-1, 220-2. The bridge configurations 220-1, 220-2 illustrated in FIG. 4b may be employed in connection with the embodiment illustrated in FIG. 3. For this reasons, reference is explicitly made here to the respective sections of the description in connection with FIG. 3. In contrast to the embodiment shown in FIG. 3 which only comprises a single bridge configuration 220, an implementation of two full bridge circuits for the x component and the y component is advisable here due to the detection range of 360° of the respective angle sensor. For this reason, the switch matrices 210-1 to 210-4 of the sensor device in FIG. 4b have been extended compared to that of FIG. 3, so that switching-in the additional sensor elements 140' to the sensor elements 140 may be performed in parallel for both bridge configurations 220-1, 220-2.

It may be advisable in an implementation of the bridge configurations 220-1, 220-2 illustrated in FIG. 4b to extend the evaluation circuit 230 of FIG. 3 by introducing a second analog-to-digital converter 240 also connected to the digital signal processor 250. In this case, the bridge configuration 220-1 and the bridge configuration 220-2 may, for example, be connected to the digital signal processor 250 via separate analog-to-digital converters 240 to be able to provide a respective evaluation signal at the evaluation signal output 280.

Figure 5A:
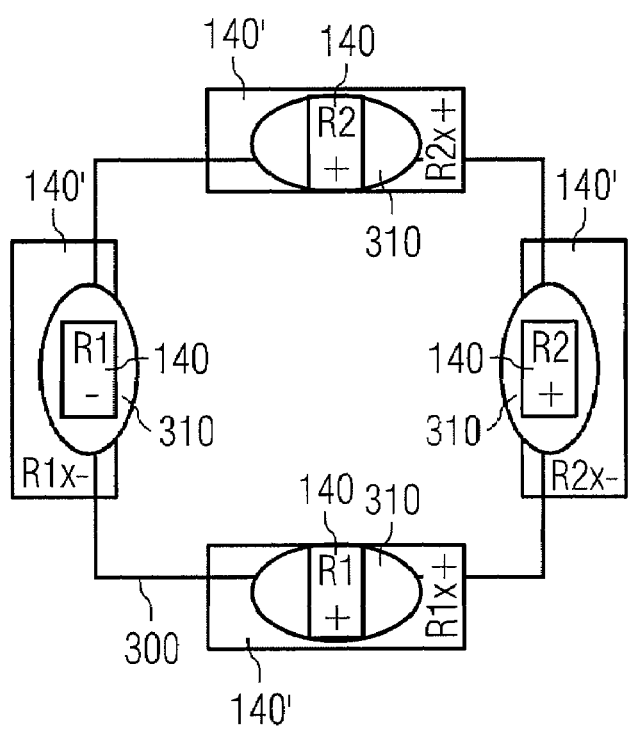
FIG. 5a shows a geometrical arrangement of the sensor elements and the additional sensor elements of the sensor assembly and the additional sensor assembly of a pressure sensor according to another embodiment.
Figure 5B:
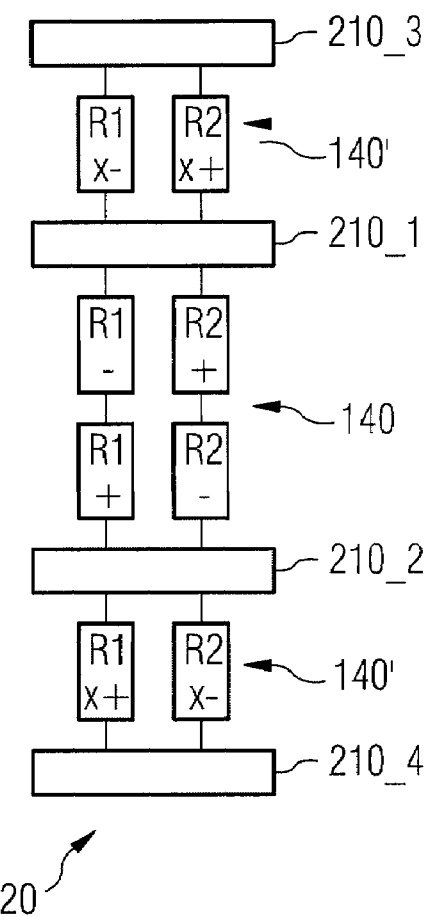

FIGS. 5a and 5b show another embodiment of a geometrical configuration in FIG. 5a and of a bridge configuration 220 in FIG. 5b in the case of a piezo-resistive pressure sensor as another embodiment. Thus, FIG. 5a shows a diaphragm 300 of a pressure sensor at the edge of which resistor elements or resistors of a piezo-resistive pressure sensor are arranged. Here, the regions 310 show regions of the greatest deformation or greatest stress of the diaphragm 300. The sensor elements 140 of the sensor assembly are each arranged in the center in the regions 310 of the greatest mechanical deformation of the diaphragm 300 to obtain the greatest measuring signal possible, i.e. in the case of resistive sensor elements 140 the greatest change of the resistances of the sensor elements 140 possible. The additional sensor elements 140' of the additional sensor assembly here are arranged such that they are at least partly in the regions 310 of the greatest deformation of the diaphragm 300. Put differently, FIG. 5a shows how the resistors 140, 140' of a piezo-resistive pressure sensor may be arranged in relation to the zones 310 of maximum stress at the edge of the diaphragm 300.

As has already been discussed in connection with FIG. 4, the additional sensor elements 140' in FIGS. 5a and 5b, too, are marked by a supplement "x". In addition, number 1 or number 2 in the sensor elements 140, 140' indicated in FIGS. 5a and 5b designates their membership to a first or second half bridge circuit of the full bridge circuit used in connection with the subsequent pressure detection. The statements "+" and "−" in FIGS. 5a and 5b additionally characterize whether an increase in resistance or decrease in resistance occurs in the case of a predetermined deformation of the diaphragm or a predetermined deformation of the respective sensor element. As far as technology is concerned, this may, for example, be realized by the respective sensor elements 140, 140' comprising different dopings and/or a corresponding bias.

FIG. 5b shows the bridge configuration 220 resulting from connecting the sensor elements 140 of the sensor assembly and the additional sensor elements 140' of the additional sensor assembly. The bridge configuration 220 illustrated in FIG. 5b may, for example, be employed in connection with a sensor device as is illustrated in FIG. 3.

As the embodiments illustrated in FIGS. 3-5 have shown, the sensor devices comprise resistors or sensor elements 140, 140' for a full bridge or full bridge circuit which may be assembled by a configurable series connection of individual resistors or individual sensor elements 140, 140'. The sensor elements or sensor resistors 140, 140' and their supply lines here may usually be recognized easily since they are, for example in the case of a GMR sensor, on a surface of the respective chip or at striking locations of the respective chip, exemplarily in the region of the diaphragm edge or the edge of the diaphragm 300 in the case of a pressure sensor.

As the embodiments shown in connection with the present application have shown, sensor devices may, for example, be employed in the field of resistive sensors which may require a temporary energy-saving operation (low-power operation) or make this advisable where cutbacks in signal quality can be tolerated. As has already been mentioned, angle sensors having revolution counters are examples of this.

As has already been discussed, the embodiments of a sensor device allow switching between a normal operating mode where a high resolution is ensured or allowed, and an energy-saving operating mode having a reduced power demand. Embodiments, thus, among other things, may include GMR sensors or GMR angle sensors having a reduced power demand.

Another way of further reducing the power demand of a sensor device is operating the respective sensor in a pulsed manner, wherein, however, the speed of the signal evaluation by the evaluation circuit must correspondingly be very fast to be able to achieve truly low average powers. However, this very often entails the requirement of switching off the evaluation circuit or the signal processing electronics and the buffers for the corresponding bridge supply since the power demand thereof also increases considerably due to the high speed requirements in pulsed operation. Further influence on the current consumption and the measurement duration of a circuit typically results, in the case of a pulsed operation, from a requirement to the signal-to-noise ratio (SNR). Typically, in this case the current or power demand also increases when a certain signal-to-noise ratio is to be achieved or the signal/s of the respective sensor elements become/s smaller. Put differently, generally the current or power demand will increase if the individual sensor elements or sensors are getting more insensitive or the measuring duration is to be extended correspondingly. In this connection, it must also be kept in mind that another limitation for switching on/off in connection with a pulse operation (on/off rate) results from the necessary duration for executing the actual function, and additionally the time for the indispensable settling of the respective circuits and circuit components in real implementation has to be considered after having activated the supply voltage or supply circuits.

As the embodiments have illustrated clearly, embodiments of sensor devices allow a reduction in the current consumption or power demand without entailing a corresponding reduction in sensitivity of the respective sensor device. The reason for this is that additional sensor elements may be connected into the overall sensor assembly which in turn allow a measuring signal.

In reaction thereto, alternatively or in addition to the pulse operation described above, the excitation voltage or voltage of a voltage source supplied to the sensor bridges may of course also be reduced, which of course reduces the current consumption proportionally. This, however, entails a corresponding proportional reduction in sensitivity of the respective sensor device unless the respective excitation voltage can be provided by a second voltage source which is completely decoupled from the first one so that no voltage conversions are necessary which generally always result in a loss in energy.

Depending on the circumstances, an embodiment of the method for detecting a measurable quantity may be implemented in either hardware or software. The implementation may be on a digital storage medium, in particular on a disc, CD or DVD having control signals which may be read out electronically which can cooperate with a programmable computer system such that the embodiment of the method for detecting a measurable quantity will be executed. In general, embodiments, thus, are also in a software program product or a computer program product or a program product having a program code stored on a machine-readable carrier for performing an embodiment of the method when the software program product runs on a computer or a processor. Expressed differently, an embodiment may, thus, also be realized as a computer program or software program or program having a program code for performing an embodiment of the method when the program runs on a processor. The processor here may be formed by a computer, a chipcard (smart card) or another integrated circuit.

To simplify the illustration, the same reference numerals will be used in the further course of the present application for objects having the same or similar functional features. Thus, sensor elements 140 and additional sensor elements 140', for example, will in the further course of the present application both be referred to by the reference numeral 140. This rule will only be deviated from if a corresponding differentiation is necessary.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A sensor device comprising:
   a sensor assembly comprising at least one sensor element;
   an additional sensor assembly comprising at least one additional sensor element;
   a switch-in element coupling the additional sensor assembly to the sensor assembly responsive to a switch-in signal to selectively achieve an overall sensor assembly comprising the sensor assembly and the additional sensor assembly; and a supply circuit configured to provide a first supply signal comprising a first power value to the sensor assembly and a second supply signal comprising a second power value to the overall assembly, wherein the overall sensor assembly has a reduced power demand so that the second power value is smaller than the first power value.

2. The sensor device according to claim 1, wherein the at least one sensor element and the at least one additional sensor element comprise a magneto-resistive sensor element or a piezo-resistive sensor element.

3. The sensor device according to claim 2, wherein a magneto-resistive sensor element comprises a GMR (giant magneto resistance) structure, a TMR (tunnel magneto resistance) structure, a spin valve structure, an AMR (anisotropic magneto resistance) structure or an EMR (extraordinary magneto resistance) structure.

4. The sensor device according to claim 1, wherein the sensor assembly comprises a full bridge circuit comprising at least four circuit elements of which at least one circuit element comprises a sensor element.

5. The sensor device according to claim 4, wherein at least one circuit element of the full bridge circuit comprises a resistive element, a resistor element, a capacity, a semiconductor device or an inductivity.

6. The sensor device according to claim 1, wherein the supply circuit is a voltage source and the switch-in element couples the additional sensor assembly to the sensor assembly to form a series connection in the form of the overall sensor assembly, or wherein the supply circuit is a current source and the switch-in element couples the additional sensor assembly to the sensor assembly to form a parallel connection as the overall sensor assembly.

7. The sensor device according to claim 1, further comprising an evaluation circuit coupled to at least one of the overall sensor assembly and the sensor assembly.

8. The sensor device according to claim 1, wherein the sensor device is a pressure sensor, a magnetic field sensor, a magnetic angle sensor or a magnetic revolution sensor.

9. A sensor device for detecting a measurable quantity by an overall sensor assembly, comprising:

a sensor assembly comprising at least one resistive sensor element;

an additional sensor assembly comprising at least one additional resistive sensor element;

a switch-in element coupled to the additional sensor assembly, the switch-in element configured to selectively couple together the sensor assembly and the additional sensor assembly, responsive to a switch-in signal, to form the overall sensor assembly having a reduced power demand; and a control circuit coupled to the switch-in element, the control circuit configured to provide the switch-in signal.

10. The sensor device according to claim 9, wherein the at least one sensor element and the at least one additional sensor element comprise a magneto-resistive sensor element or a piezo-resistive sensor element.

11. The sensor device according to claim 10, wherein a magneto-resistive sensor element comprises a GMR (giant magneto resistance) structure, a TMR (tunnel magneto resistance) structure, a spin valve structure, an AMR (anisotropic magneto resistance) structure or an EMR (extraordinary magneto resistance) structure.

12. The sensor device according to claim 9, wherein the sensor assembly comprises a full bridge circuit comprising at least four circuit elements of which at least one circuit element comprises a sensor element.

13. The sensor device according to claim 12, wherein a circuit element comprises a sensor element, a resistive sensor element, a resistor element, a capacity, a semiconductor device or an inductivity.

14. The sensor device according to claim 9, further comprising a supply circuit providing a first supply signal comprising a first power value to the sensor assembly and providing, responsive to the switch-in signal, a second supply signal comprising a second power value to the overall assembly, the second power value being smaller than the first power value.

15. The sensor device according to claim 14, wherein the supply circuit is a voltage source and the switch-in element couples the additional sensor assembly to the sensor assembly to form a series connection in the form of the overall sensor assembly, or wherein the supply circuit is a current source and the switch-in element couples the additional sensor assembly to the sensor assembly to form a parallel connection as the overall sensor assembly.

16. The sensor device according to claim 9, further comprising an evaluation circuit coupled to at least one of the overall sensor assembly and the sensor assembly.

17. The sensor device according to claim 9, wherein the sensor device is a pressure sensor, a magnetic field sensor, a magnetic angle sensor or a magnetic revolution sensor.

18. A sensor device comprising:

sensor means comprising at least one detection means for detecting a measurable quantity;

additional sensor means comprising at least one additional detection means;

switch-in means coupling the additional sensor means to the sensor means responsive to a switch-in signal to selectively achieve an overall sensor assembly comprising the sensor assembly and the additional sensor assembly; and a supply means configured to provide a first supply signal comprising a first power value to the sensor means and a second supply signal comprising a second power value to the overall sensor assembly, wherein the overall sensor assembly has a reduced power demand so that the first power value is greater than the second power value.

19. The sensor device according to claim 18, wherein the at least one detection means for detecting a measurable quantity and the at least one additional detection means comprise a sensor element, a magneto-resistive sensor element or a piezo-resistive sensor element.

20. The sensor device according to claim 18, wherein the supply means comprises a voltage source or a current source.

21. The sensor device according to claim 18, further comprising evaluation means coupled to at least one of the overall sensor assembly and the sensor means to provide an evaluation signal.

22. The sensor device according to claim 18, further comprising a supply circuit providing a first supply signal comprising a first power value to the sensor assembly and providing, responsive to the switch-in signal, a second supply signal comprising a second power value to the overall assembly, the second power value being smaller than the first power value.

23. A method for detecting a measurable quantity by a sensor device comprising a sensor assembly comprising at least one sensor element and an additional sensor assembly comprising at least one additional sensor element, comprising the step of:

switching in the additional sensor assembly, upon receipt of a switch-in signal, to the sensor assembly to selectively achieve an overall sensor assembly comprising the sensor assembly and the additional sensor;

wherein a first supply signal comprising a first power value is provided to the sensor assembly, wherein a second supply signal comprising a second power value is provided to the overall sensor assembly, and wherein the overall sensor assembly has a reduced power demand so that the second power value is smaller than the first power value.

24. The method according to claim 23, further comprising the step of:

detecting the measurable quantity by the sensor assembly.

25. The method according to claim 23, further comprising the step of:

detecting the measurable quantity by the overall sensor assembly.

26. A computer program product comprising a computer usable medium storing a program code for performing a method for detecting a measurable quantity by a sensor device comprising a sensor assembly comprising at least one sensor element and an additional sensor assembly comprising at least one additional sensor element, the method comprising the step of: switching in the additional sensor assembly, upon receipt of a switch-in signal, to the sensor assembly to selectively achieve an overall sensor assembly comprising the sensor assembly and the additional sensor assembly, when the program runs on a processor;

wherein a first supply signal comprising a first power value is provided to the sensor assembly, wherein a second supply signal comprising a second power value is provided to the overall sensor assembly, and wherein the overall sensor assembly has a reduced power demand so that the second power value is smaller than the first power value.

27. A sensor device comprising:

a sensor assembly comprising at least one sensor element;

an additional sensor assembly comprising at least one additional sensor element;

a switch-in element coupling the additional sensor assembly to the sensor assembly responsive to a switch-in signal to achieve an overall sensor assembly comprising a reduced power demand; and a supply circuit providing a first supply signal comprising a first power value to the sensor assembly and providing, responsive to the switch-in signal, a second supply signal comprising a second power value to the overall assembly, the second power value being smaller than the first power value.

* * * * *